United States Patent
Liu et al.

(10) Patent No.: US 7,855,143 B2
(45) Date of Patent: Dec. 21, 2010

(54) INTERCONNECT CAPPING LAYER AND METHOD OF FABRICATION

(75) Inventors: Huang Liu, Singapore (SG); Bangun Indajang, Singapore (SG); Wei Lu, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 725 days.

(21) Appl. No.: 11/614,996

(22) Filed: Dec. 22, 2006

(65) Prior Publication Data

US 2008/0150137 A1 Jun. 26, 2008

(51) Int. Cl.
   *H01L 21/4763* (2006.01)
(52) U.S. Cl. .............. 438/643; 438/622; 438/625; 438/642; 438/647; 257/751; 257/754; 257/E23.141; 257/E21.495
(58) Field of Classification Search ............ 257/751, 257/754, E23.141, E21.495; 438/622, 625, 438/642, 643, 647, 655
   See application file for complete search history.

(56) References Cited

U.S. PATENT DOCUMENTS

| | | | |
|---|---|---|---|
| 5,899,740 A | 5/1999 | Kwon | |
| 6,171,949 B1 * | 1/2001 | You et al. | 438/633 |
| 6,211,084 B1 | 4/2001 | Ngo et al. | |
| 6,268,291 B1 | 7/2001 | Andricacos et al. | |
| 6,339,025 B1 | 1/2002 | Liu et al. | |
| 6,436,825 B1 | 8/2002 | Shue | |
| 6,573,606 B2 * | 6/2003 | Sambucetti et al. | 257/762 |
| 6,660,634 B1 | 12/2003 | Ngo et al. | |
| 2002/0155702 A1 | 10/2002 | Aoki et al. | |
| 2004/0023489 A1 | 2/2004 | Chopra | |
| 2004/0072424 A1 | 4/2004 | Chopra | |
| 2004/0077183 A1 | 4/2004 | Chung | |
| 2004/0266171 A1 | 12/2004 | Aoki et al. | |
| 2006/0286797 A1 * | 12/2006 | Zhang et al. | 438/659 |
| 2007/0123043 A1 * | 5/2007 | Streck et al. | 438/687 |
| 2007/0123044 A1 * | 5/2007 | Hohage et al. | 438/687 |

FOREIGN PATENT DOCUMENTS

| | | |
|---|---|---|
| EP | 0991114 A2 | 4/2000 |
| GB | 2375888 A | 11/2002 |
| WO | 02073689 A2 | 9/2002 |

* cited by examiner

*Primary Examiner*—Matthew C Landau
*Assistant Examiner*—Colleen E Snow
(74) *Attorney, Agent, or Firm*—Horizon IP Pte Ltd

(57) ABSTRACT

The present invention relates to an interconnect capping layer and a method of fabricating a capping layer for an interconnect. In particular, but not exclusively, the invention relates to a capping layer for a copper interconnect used to interconnect elements in an integrated circuit. Embodiments of the invention provide a method of fabricating a capping layer for an interconnect in an integrated circuit, comprising the steps of: forming an interconnect comprising upper and lower lateral surfaces; forming a lateral diffusion stop layer between said lateral surfaces; and forming a capping layer.

19 Claims, 3 Drawing Sheets

INTERCONNECT CAPPING LAYER AND METHOD OF FABRICATION

FIELD OF THE INVENTION

The present invention relates to a capping layer and a method of fabricating a capping layer for an interconnect. In particular, but not exclusively, the invention relates to a capping layer for a copper interconnect used to interconnect elements in an integrated circuit.

DESCRIPTION OF THE RELATED ART

Integrated circuits (ICs) comprising many tens of thousands of devices including field effect transistors (FETs) and other devices are a cornerstone of modern microelectronic systems. These integrated circuits have structural elements associated with them. As the packing density of the devices increases, the number and complexity of wiring structures forming interconnections between the various elements increases. Connections between the elements of the IC are known as interconnects and are typically arranged in laterally extensive sheets or layers, known as traces. Interconnects within a given trace are separated by an intralevel dielectric, whilst individual traces are separated by layers of an interlevel dielectric. Connections between traces may be made by forming transverse interconnects which are often referred to as 'vias'.

Modern integrated circuits typically employ copper as the material of choice for forming interconnects in preference to aluminium since copper has a lower electrical resistance than aluminium. In addition, copper exhibits a higher resistance to electromigration. Both of these properties are desirable in producing improved integrated circuits.

Copper suffers the disadvantage however that it diffuses readily into a variety of materials including silicon and a number of dielectric materials associated with integrated circuits. In order to electrically isolate interconnects in integrated circuits, it is common practice to provide dielectric materials between interconnects. However, copper diffusion into these materials can result in a deterioration in the integrity of the interconnects, and the formation of undesirable conductive paths between elements of the integrated circuit.

In order to address the issue of copper diffusion from interconnects, barrier layers between a copper interconnect and adjacent dielectric materials may be provided. Capping layers are barrier layers formed generally on the upper surfaces of interconnects. SiN, SiC, SiCN and SiCO are currently used as capping layers for interconnects. These materials serve as a barrier against copper diffusion, and as an etch stop for any subsequent dual damascene etch processes.

However, these and a number of other materials have a relatively high dielectric constant k. For example, SiN has a dielectric constant of 7, and SiCN has a dielectric constant of 4.8-5.6. Thus, when the materials are used as blanket capping layers, an undesirable increase in the effective dielectric constant of the overall dielectric stack structure occurs. Blanket capping layers are capping layers that cover not only the interconnect but also substantially all exposed areas of the surface of the substrate.

One way of reducing the effective dielectric constant is to form self-aligned barrier layers, rather than blanket barrier layers. As will be described hereinbelow, self-aligned barrier layers are layers whose coverage of the substrate is, substantially, limited to portions of interconnects of the integrated circuit that are exposed at the surface of the substrate.

One material suitable for use as a self-aligned barrier over copper interconnects is copper silicon nitride ($CuSi_xN_y$). Copper silicon nitride has been used as a capping layer for copper interconnects since it has good barrier properties against copper diffusion and electromigration, and is suitable for use as an etch stop in dual damascene etch processes.

Copper silicon nitride is normally formed by exposing a copper interconnect to silane gas ($SiH_4$) at a suitable temperature, leading to the formation of a copper silicide layer. The copper silicide layer thereby formed is then converted to a copper silicon nitride layer by exposure to reactive nitrogen, for example by exposure to an ammonia ($NH_3$) plasma treatment.

However, this process has a number of problems associated with it. Due to the high solubility of silicon in copper, silicon readily diffuses deep into the interconnect and away from the region of the interconnect in which it is desired to form the copper silicide layer. This results in an increase in the electrical resistance of the interconnect.

In order to reduce the amount of silicon diffusion into the interconnect, the silane flow, the period for which the interconnect is exposed to silane (silane "soak time") and the copper surface temperature during silane exposure must be strictly controlled. Consequently, the copper silicon nitride layer formed by this technique is relatively thin (of the order of 40 Å). Furthermore, the uniformity of the copper silicon nitride is poor, which reduces the effectiveness of the capping layer in reducing electromigration of copper.

A copper silicon nitride layer formed by the technique described above is too thin to serve as an etch stop layer in dual damascene via etch processes. Consequently, a further dielectric barrier layer (such as SiN, SiCN, SiC or SiCO) must be formed over the copper silicon nitride layer before such processes can be performed. The presence of this further barrier layer results in an undesirable increase in the effective dielectric constant of intermetal dielectric (IMD) stacks.

SUMMARY OF THE INVENTION

It is an aim of the present invention to at least partly mitigate at least one of the above-mentioned problems.

It is a further aim of embodiments of the invention to provide an improved interconnect structure. Another aim of embodiments of the present invention is to provide a fabrication method for an improved interconnect structure.

It is an aim of embodiments of the present invention to provide capping layers for interconnects so as to reduce diffusion of copper from interconnects comprising copper.

It is an aim of embodiments of the invention to reduce an amount of silicon diffusion into the interconnect, away from the region in which it is desired to form the capping layer, during formation of the capping layer.

It is an aim of embodiments of the invention to increase the thickness of capping layers in order to provide an improved barrier to copper diffusion and an improved etch stop layer for dual damascene via etch processes.

According to a first aspect of the invention there is provided a method of fabricating a capping layer for an interconnect in an integrated circuit, comprising the steps of: forming an interconnect comprising upper and lower lateral surfaces; forming a lateral diffusion stop layer between said lateral surfaces; and forming a capping layer.

According to a second aspect of the present invention there is provided apparatus for connecting elements in an integrated circuit device, comprising: at least one interconnect; and a capping layer on an upper lateral surface of the interconnect, wherein the capping layer comprises a layer of $CuSi_xN_y$ having a thickness sufficient to provide an etch stop.

According to a third aspect of the present invention there is provided apparatus for connecting elements in an integrated circuit device, comprising: at least one interconnect; and a capping layer on an upper surface of the interconnect, the capping layer comprising a first material, the first material comprising $CuSi_xN_y$, the capping layer having a maximum thickness defined by an interlayer.

Embodiments of the invention provide an integrated circuit having a reduced electrical resistance associated with interconnects of the integrated circuit. The reduction in electrical resistance is provided at least in part by a reduction in the amount of silicon incorporated into copper interconnects during fabrication of the integrated circuit. Silicon may become incorporated into an interconnect during formation of capping layers over the interconnect; capping layers are formed in order to provide a barrier to copper diffusion and electromigration.

In embodiments of the invention reduced electrical resistance of interconnects of an integrated circuit is achieved by forming a lateral diffusion stop layer between upper and lower lateral surfaces of the interconnect, before forming the capping layer. The diffusion stop layer defines a lower boundary of a subsequently formed capping layer. Embodiments of the invention provide a capping layer formed of copper silicon nitride.

Embodiments of the invention provide apparatus for connecting elements in an integrated circuit device having capping layers of increased structural stability. Increased structural stability is provided at least in part by increasing the thickness of the capping layer. The increase in thickness of the capping layer is made possible by the presence of a lateral diffusion stop layer between upper and lower lateral surfaces of the interconnect. The lateral diffusion stop layer reduces an amount of silicon diffusing to regions of the interconnect in which formation of a capping layer is undesirable.

BRIEF DESCRIPTION OF THE DRAWINGS

Embodiments of the present invention will now be described hereinafter, by way of example only, with reference to the accompanying drawings, in which.

DETAILED DESCRIPTION OF THE INVENTION

The following embodiments are intended to illustrate the invention more fully without limiting their scope, since numerous modifications and variations will be apparent to those skilled in the art.

Hereinafter reference will be made to the term 'interconnect'. It will be understood that the term should be broadly construed to include not only connections between elements of an IC arranged in the form of one or more traces, but also any suitable structure in which one or more conductive lines between elements of a system on a substrate are provided.

Figure 1:
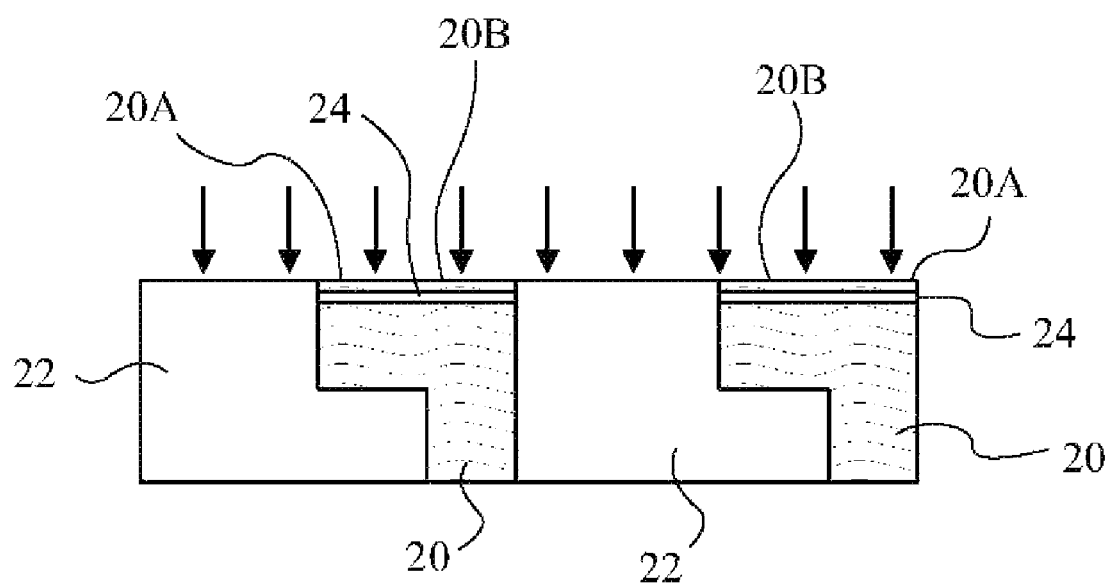
FIGS. 1 to 3 show structures formed during a process of fabricating an interconnect structure.
Figure 2:
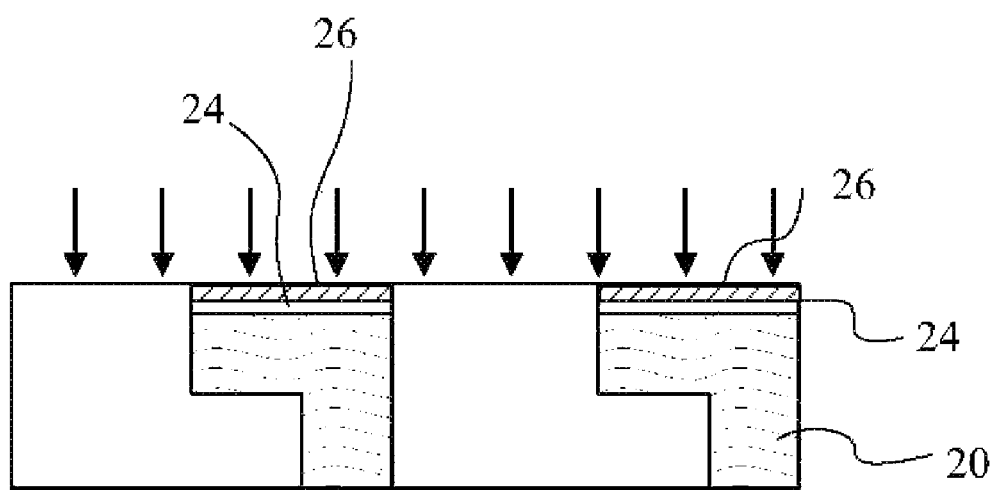
Figure 3:
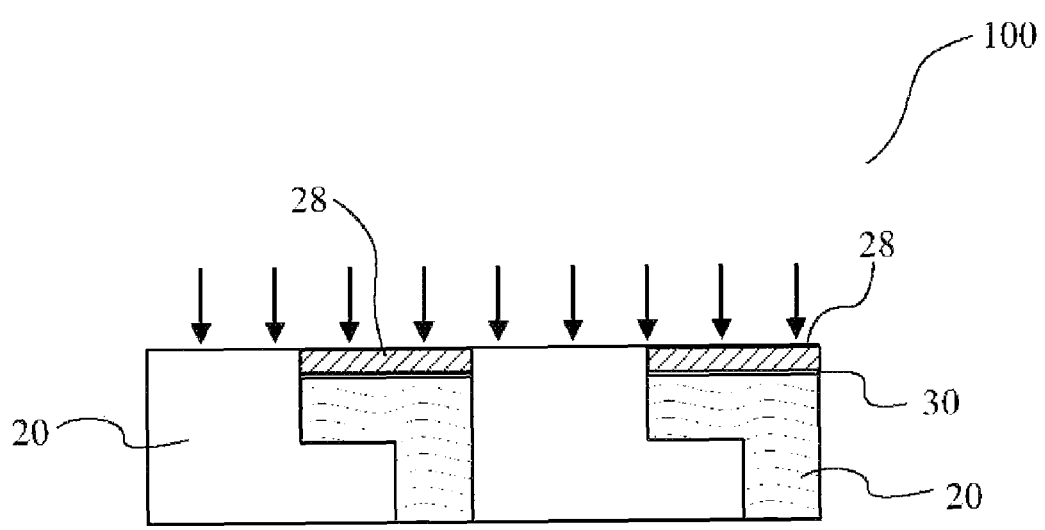

FIGS. 1 to 3 illustrate structures formed during fabrication of an interconnect structure 100 (FIG. 3) in accordance with an embodiment of the present invention.

FIG. 1 shows a pair of interconnects 20 formed over a semiconductor substrate. The interconnects 20 are separated by a dielectric material. The dielectric material, for example, is a low k dielectric material. By low dielectric constant is meant a dielectric constant in the range from about 4.0 to about 3.0. In some embodiments of the invention the dielectric material has an ultra-low dielectric constant. By ultra-low dielectric constant is meant a dielectric constant of less than about 3. Providing other types of dielectric materials is also useful.

The interconnects 20, in one embodiment, are formed from copper. In some embodiments of the invention sidewalls of the interconnects 20 are lined with a barrier layer to prevent diffusion of copper into the dielectric material 22. Other types of conductive materials can also be used to form the interconnects. In one embodiment, the interconnect is formed by damascene techniques. Other techniques can also be used to form the interconnects.

Following formation of the copper interconnects 20, a self-aligned interlayer 24 is formed below the upper surface 20A of each interconnect 20. The interlayer serves as a barrier layer, for example against diffusion of silicon atoms into the interconnect during subsequent processing of the structure.

A capping layer is subsequently formed on the surface of the interconnect. In one embodiment, the interlayer defines a maximum depth or thickness of the subsequently formed capping layer.

In one embodiment, the interlayer is formed at a depth of between about 50 Å and about 400 Å below the surface 20A. Preferably, the interlayer 24 is formed at a depth of between 100 Å and 350 Å below the surface 20A. A layer of copper 20B therefore separates the interlayer 24 from the surface 20A of the interconnect 20.

In one embodiment, the interlayer comprises copper nitride ($CuN_x$). The $CuN_x$ interlayer 24 can be formed through nitrogen implantation. Other techniques for forming the interlayer are also useful. For example, the interlayer can be formed by nitrogen microwave annealing, nitrogen laser annealing, or any other suitable technique. The distance of the interlayer 24 below the surface 20A may be controlled by adjusting the implantation energy of the nitrogen species, or microwave or laser annealing power and time.

FIG. 2 shows the structure of FIG. 1 following cleaning of the upper surface 20A of the interconnect 20 by a surface cleaning process, and reaction of copper layer 20B above the copper nitride layer 24 to form a copper silicide ($CuSi_x$) layer 26.

Cleaning of the interconnect surface 20A is performed by exposure to hydrogen plasma at a temperature in the range from about 200 to about 400° C. for a period of from about 5 to about 60 seconds. A preferred hydrogen plasma exposure is performed at a temperature in the range from about 250 to about 350° C. for a period from about 10 to about 30 seconds. It will be readily understood by those skilled in the art that the temperature and exposure time may be adjusted in order to optimise the cleaning process.

In alternative embodiments of the invention, cleaning is performed by exposure of the substrate to a plasma formed from a gas comprising ammonia or a mixture of ammonia and nitrogen, at a substrate temperature of from about 200 to about 400° C. for a period of from about 5 to about 60 seconds. A preferred plasma exposure is performed at a temperature from about 250 to about 350° C. for a period from about 10 to about 30 seconds. It will readily be appreciated by persons skilled in the art that the temperature and period may be adjusted in order to optimise the cleaning conditions.

The surface cleaning process reduces the copper oxide on the copper surface to copper metal. The treatment is also found to increase the reactivity of the copper interconnect during subsequent processing.

Reaction of copper layer 20B to form copper silicide layer 26 is accomplished by exposing the substrate to silane gas ($SiH_4$) at a temperature of from about 200° C. to about 400°

C. A preferred temperature range is from about 250 to about 350° C. Silane gas decomposes on the copper interconnect surface 20A to form silicon species and hydrogen species. The silicon species diffuse into the copper interconnect 20 and react with the copper to form a self-aligned copper silicide.

In accordance with one embodiment of the invention, the interlayer acts as a barrier against diffusion of silicon species. This prevents diffusion of silicon beyond the interlayer 24. The presence of the interlayer 24 thus prevents the line resistance of the copper interconnect from increasing due to diffusion of silicon beyond the interlayer 24.

FIG. 3 shows the structure of FIG. 2 following exposure of the structure to an in-situ plasma formed from a gas comprising ammonia gas. The plasma treatment is performed in order to convert copper silicide to stable copper silicon nitride ($CuSi_xN_y$). In embodiments of the invention the structure is exposed to an in-situ plasma formed from a gas comprising a mixture of ammonia and nitrogen gases. In embodiments of the invention the plasma treatment is performed for an extended period and at increased power in order to ensure that the copper nitride interlayer 24 is converted to a copper silicon nitride layer ($CuSi_xN_y$) 30.

The structure is processed to improve the stability of the copper silicide. In one embodiment, as shown in FIG. 3, the structure is processed to covert the copper silicide to copper silicon nitride ($CuSi_xN_y$). In one embodiment, the processing comprises plasma treatment. In one embodiment, the structure is exposed to plasma formed from a gas comprising ammonia gas. In one embodiment, the structure is exposed to plasma formed from ammonia and nitrogen gases. Preferably, the plasma is an in-situ plasma. Other types of processing for converting the copper silicide to copper silicide nitride are also useful.

In one embodiment, the process is sufficient to convert the interlayer comprising copper nitride to copper silicon nitride. This results in a capping layer having a depth defined by the depth of the interlayer. In one embodiment, the plasma treatment is performed for an extended period and at increased power in order to ensure that the copper nitride interlayer 24 is converted to a copper silicon nitride layer ($CuSi_xN_y$) 30.

In alternative embodiments reaction of copper silicide to form stable copper silicon nitride is performed by an ex-situ microwave annealing or laser annealing with a gas comprising ammonia or a mixture of ammonia and nitrogen. In still further embodiments of the invention, reaction of copper silicide to form stable copper silicon nitride is performed by an ex-situ nitrogen implantation, electron beam irradiation or any other suitable technique.

In embodiments of the invention diffusion of silicon throughout the copper interconnect is prevented by the presence of the copper nitride interlayer 24. Thus, an increase in resistance of the interconnect 20 due to silicon diffusion throughout the interconnect is prevented.

In embodiments of the invention the thickness of the copper silicon nitride may be controlled. The thickness of the copper silicon nitride layer may be controlled by controlling the depth within the copper interconnect 20 at which the copper nitride interlayer 24 is formed. The region 28 of the copper interconnect above the copper nitride layer is converted to a copper silicide layer upon exposure to silicon. This copper silicide layer is subsequently converted to a copper silicon nitride layer upon exposure to nitrogen species.

The ability to control the thickness of the copper silicon nitride layer is helpful since it is desirable to have a copper silicon nitride layer sufficiently thick to act as an etch stop layer. It is also desirable to have a copper silicon nitride layer that is sufficiently thick to act as an effective barrier to out-diffusion of copper from the interconnect. A copper silicon nitride capping layer according to some embodiments of the invention can therefore be made thick enough that dielectric SiN, SiCN, SiC or SiCO barriers are unnecessary, without causing a significant increase in the electrical resistance of interconnects of an integrated circuit due to diffusion of Si into the interconnect away from the capping layer.

Throughout the description and claims of this specification, the words "comprise" and "contain" and variations of the words, for example "comprising" and "comprises", means "including but not limited to", and is not intended to (and does not) exclude other moieties, additives, components, integers or steps.

Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith.

What is claimed is:

1. A method of fabricating an integrated circuit comprising:
   providing an substrate prepared with an interconnect in a dielectric layer, the interconnect having upper and lower lateral surfaces;
   forming a diffusion stop layer between the lateral surfaces, wherein a top surface of the diffusion stop layer is spaced apart from the upper lateral surface of the interconnect; and
   forming a capping layer after forming the diffusion stop layer, wherein the diffusion stop layer limits an extension of the capping layer beyond a lower surface of the diffusion stop layer.

2. A method as claimed in claim 1 wherein the step of forming the diffusion stop layer comprises a step of forming a layer of a first material.

3. A method as claimed in claim 2 wherein the step of forming the layer of the first material comprises a step of implanting ions into said interconnect.

4. A method as claimed in claim 2 wherein the step of forming the diffusion stop layer comprises a step of introducing nitrogen into the interconnect thereby to form a copper nitride layer.

5. A method as claimed in claim 1 wherein the step of forming a capping layer comprises a step of forming a silicide layer.

6. A method as claimed in claim 5 wherein the step of forming the silicide layer comprises a step of exposing the upper lateral surface of the interconnect to silicon.

7. A method as claimed in claim 6 wherein the step of exposing the upper lateral surface of the interconnect to silicon comprises a step of exposing the upper lateral surface to a gas comprising silicon.

8. A method as claimed in claim 7 wherein the step of exposing the upper lateral surface of the interconnect to the gas comprising silicon comprises a step of exposing the upper lateral surface to a gas comprising silane.

9. A method as claimed in claim 5 further comprising a step of subsequently forming a layer comprising silicon and nitrogen from at least a portion of the silicide layer.

10. A method as claimed in claim 9 wherein the step of forming the layer comprising silicon and nitrogen comprises a step of exposing the interconnect to nitrogen species.

11. A method as claimed in claim 10 wherein the step of exposing the interconnect to nitrogen species comprises a step of exposing the upper lateral surface of the interconnect to a gas comprising ammonia.

12. A method as claimed in claim 11 wherein the step of exposing the interconnect to the gas comprising ammonia further comprises a step of exposing the interconnect to a plasma formed from said gas.

13. A method as claimed in claim 10 wherein the step of exposing the interconnect to nitrogen species comprises a step of exposing a surface of the interconnect in the presence of nitrogen species to at least one selected from amongst microwave irradiation, laser beam irradiation or electron beam irradiation.

14. A method as claimed in claim 10 wherein the step of forming the layer comprising silicon and nitrogen further comprises a step of forming a layer comprising silicon and nitrogen from at least a portion of the diffusion stop layer.

15. A method as claimed in claim 1 wherein the step of providing the substrate prepared with the interconnect in a dielectric layer further comprises a step of forming the interconnect comprising copper.

16. A method as claimed in claim 1 wherein the step of forming the diffusion stop layer comprises a step of forming a buried diffusion stop layer having a portion of the interconnect above and below the buried diffusion stop layer.

17. A method as claimed in claim 1 wherein the capping layer extends from the upper lateral surface of the interconnect.

18. A method as claimed in claim 17 wherein the capping layer is in contact with the diffusion stop layer.

19. A method of fabricating an integrated circuit comprising:

providing an substrate prepared with an interconnect in a dielectric layer, the interconnect having upper and lower lateral surfaces;

forming a diffusion stop layer within the interconnect;

forming a capping layer; and wherein the capping layer is located over the diffusion stop layer and the diffusion stop layer is capable of limiting an extension of the capping layer beyond a lower surface of the diffusion stop layer.

* * * * *